(12) United States Patent
Abidi et al.

(10) Patent No.: US 10,311,993 B2
(45) Date of Patent: Jun. 4, 2019

(54) COTTON FIBER DISSOLUTION AND REGENERATION AND 3D PRINTING OF CELLULOSE BASED CONDUCTIVE COMPOSITES

(71) Applicant: Texas Tech University System, Lubbock, TX (US)

(72) Inventors: Noureddine Abidi, Lubbock, TX (US); Yang Hu, Lubbock, TX (US)

(73) Assignee: Texas Tech University System, Lubbock, TX (US)

(*) Notice: Subject to any disclaimer, the term of this patent is extended or adjusted under 35 U.S.C. 154(b) by 65 days.

(21) Appl. No.: 15/355,480

(22) Filed: Nov. 18, 2016

(65) Prior Publication Data

US 2017/0140848 A1   May 18, 2017

Related U.S. Application Data

(60) Provisional application No. 62/256,837, filed on Nov. 18, 2015.

(51) Int. Cl.

| *H01B 1/12* | (2006.01) |
| *C08B 15/02* | (2006.01) |
| *C08L 1/02* | (2006.01) |
| *H01L 31/02* | (2006.01) |
| *D01F 2/08* | (2006.01) |
| *B33Y 10/00* | (2015.01) |

(Continued)

(52) U.S. Cl.
CPC .............. *H01B 1/12* (2013.01); *B29C 64/112* (2017.08); *B33Y 10/00* (2014.12); *B33Y 30/00* (2014.12); *B33Y 70/00* (2014.12); *B33Y 80/00* (2014.12); *C08B 15/02* (2013.01); *C08B 16/00* (2013.01); *C08L 1/02* (2013.01); *D01F 2/08* (2013.01); *H01L 23/5328* (2013.01); *B29K 2001/00* (2013.01); *B29K 2105/0023* (2013.01); *B29K 2995/0005* (2013.01); *B29L 2031/34* (2013.01)

(58) Field of Classification Search
None
See application file for complete search history.

(56) References Cited

U.S. PATENT DOCUMENTS

| 8,962,821 B2 * | 2/2015 | Zhang | ................... C08B 1/003 536/124 |
| 2012/0115729 A1 * | 5/2012 | Qin | ...................... C08K 5/3445 504/358 |

OTHER PUBLICATIONS

Newman, "Scientists Produce Cellulose-based 3D Printed Circuitry," Rapid Ready Tech, Jun. 22, 2015. (Year: 2015).*

(Continued)

*Primary Examiner* — Catherine S Branch
(74) *Attorney, Agent, or Firm* — Edwin S. Flores; Daniel J. Chalker; Chalker Flores, LLP

(57) ABSTRACT

The present invention includes composition and methods for a core matrix comprising a dissolved cellulose fiber of, e.g., high molecular weight (DP>5000) or microcrystalline cellulose of low molecular weight (DP: 150-300), printed into a two or three dimensional pattern; a conductive material comprising a carbon nanotube or graphene oxide disposed on or about the cellulose fiber or microcrystalline cellulose; and an enhancer or stabilizer that stabilizes the dissolved cellulose or microcrystalline cellulose disrupted during a printing process, wherein the conductive material and the cellulose or microcrystalline cellulose forms one or more features in or on the cellulose fiber or microcrystalline cellulose.

11 Claims, 9 Drawing Sheets

(51) Int. Cl.
  B33Y 70/00    (2015.01)
  B33Y 30/00    (2015.01)
  B33Y 80/00    (2015.01)
  B29C 67/00    (2017.01)
  C08B 16/00    (2006.01)
  H01L 23/532   (2006.01)
  B29C 64/112   (2017.01)
  B29K 1/00     (2006.01)
  B29L 31/34    (2006.01)
  B29K 105/00   (2006.01)

(56) References Cited

OTHER PUBLICATIONS

Hipolite, "Researchers 3D Print Using Electrically Conductive, Carbon Nanotube Infused, Cellulose—Potential for Many Futuristic Uses," 3D, Jun. 17, 2015. (Year: 2015).*
Haigler, "Substrate Supply for Cellulose Systems and its Stress Sensitivity in the Cotton Fiber" in Cellulose: Molecular and Structural Biology: Selected Articles on the Synthesis, Structure, and Applications of Cellulose, Brown and Saxena (eds.), Springer 2007, p. 148. (Year: 2007).*
Han, J.S., "Properties of nonwood fibers." TAPPI 1998 North American Noonwood Symposium at Atlanta, GA, Feb. 17-18, 1998. pp. 3-12.
Fang, et al., "Characterization of cellulose and other exopolysaccharides produced from Gluconacetobacter strains." Carbohydrate polymers, 2015, vol. 115, pp. 663-669.
Lindman, et al., "On the mechanism of dissolution of cellulose." Journal of Molecular Liquids, 2010, vol. 156, pp. 76-81.
Zhang, et al. "Dissolution and regeneration of cellulose in NaOH/thiourea aqueous solution." Journal of Polymer Science Part B: Polymer Physics, 2002, vol. 40, pp. 1521-1529.
Duchemin, et al., "Aerocellulose based on all cellulose composites." Journal of Applied Polymer Science, 2010, vol. 115, pp. 216-221.
Qi, et al., "Effects of temperature and molecular weight on dissolution of cellulose in NaOH/urea aqueous solution." Cellulose, 2008, vol. 15, p. 779-787.
Jing, et al., "Solubility of wood-cellulose in LiCl/DMAC solvent system." Forestry Studies in China, 2007, vol. 9, pp. 217-220.
Perepelkin, "Lyocell fibres based on direct dissolution of cellulose in N-methylmorpholine N-oxide: development and prospects." Fibre Chemistry, 2007, vol. 39, No. 2, pp. 163-172.
Cai, et al., "Cellulose aerogels from aqueous alkali hydroxide-urea solution." ChemSusChem , 2008, vol. 1, pp. 149-154.
Savillon et al. "Aerocellulose: new highly porous cellulose prepared from cellulose-NaOH aqueous solutions." . Biomacromolecules, 2007, vol. 9, pp. 269-277.
Mazza, et al., "Influence of water on the dissolution of cellulose in selected ionic liquids." Cellulose, 2009, vol. 16, pp. 207-215.
Sescousse, et al., "Aerocellulose from cellulose-ionic liquid solutions: preparation, properties and comparison with cellulose-NaOH and cellulose-NMMO routes." Carbohydrate Polymers, 2011, vol. 83, pp. 1766-1774.
Chen, et al., "Regenerated bacterial cellulose/multi-walled carbon nanotubes composite fibers prepared by wet-spinning." Current Applied Physics, 2009, vol. 9, pp. e96-e99.
Wu, X.L, and P. Liu. Facile preparation and characterization of graphene nanosheets/polystyrene composites. Macromolecular Research, 2010, vol. 18, pp. 1008-1012.
Yan, et al., Cellulose synthesized by Acetobacter xylinum in the presence of multi-walled carbon nanotubes. Carbohydrate Research, 2008, vol. 343, pp. 73-80.
Feng, et al., "A mechanically strong, flexible and conductive film based on bacterial cellulose/graphene nanocomposite." Carbohydrate Polymers, 2012, vol. 87, pp. 644-649.
Zhang, et al. "Regenerated cellulose/grapheme nanocomposite films prepared in DMAC/LiCl solution." Carbohydrate Polymers, 2012, vol. 88, pp. 26-30.
Kim, et al., "Graphene oxide/cellulose composite using NMMO monohydrate." Carbohydrate Polymers, 2011, vol. 89, pp. 903-909.
Ladd, et al., "3D printing of Free Standing Liquid metal microstructures." Advanced Materials, 2013, vol. 25, pp. 5081-5085.
Markstedt, et al., 3D bioprinting of cellulose structures from an ionic liquid. 3D Printing and Additive Manufacturing, 2014, vol. 1, No. 3, pp. 115-121.
Wang, et al., "Wettability and surface free energy of graphene films." Langmuir, 2009, vol. 25, pp. 11078-11081.

* cited by examiner

FIG. 4C 3D printing (R.T.)

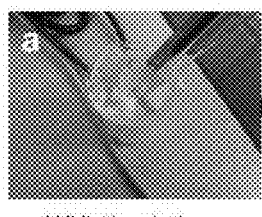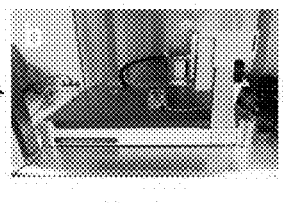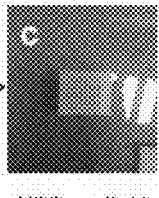
FIG. 5A      FIG. 5B      FIG. 5C
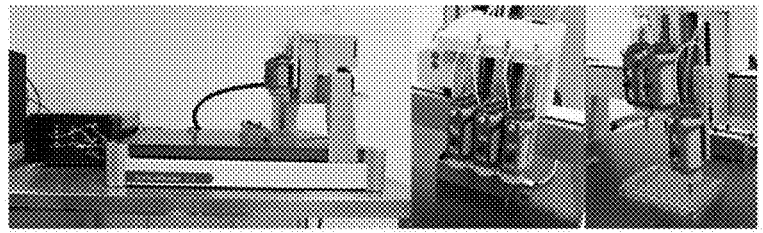
FIG. 6

- ✓ *CNC without separation* – thermal stability: less weight loss and high transition temperature for cellulose as compared to CNC (<0.22 μm)
- ✓ Relatively *more amorphous morphology for CNC* (<0.22 μm)

Samples: CNC without separation
CNC below 0.22 µm after multistage separation

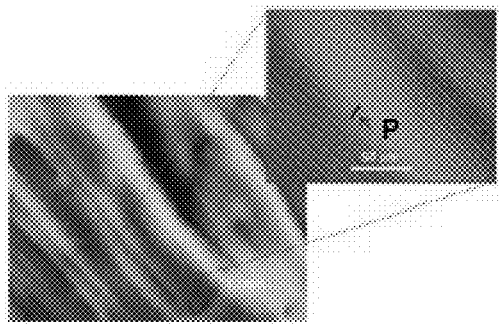

*Protocol*

- CNC-concentration tested at 0.5-0.6% w/w CNC suspension;
- For polarized light microscopy, droplets of CNC suspensions on clean glass to evaporate under ambient conditions until the dehydration.
- Observation under Nikon Eclipse LV100POL optical microscope equipped with a camera and a 530 nm wave plate;
- Estimation of the chiral nematic pitch, $P$, is twice the line spacing of the fingerprint regions of the image.

*Wu and Gray, Langmuir, 2014*

FIG. 16

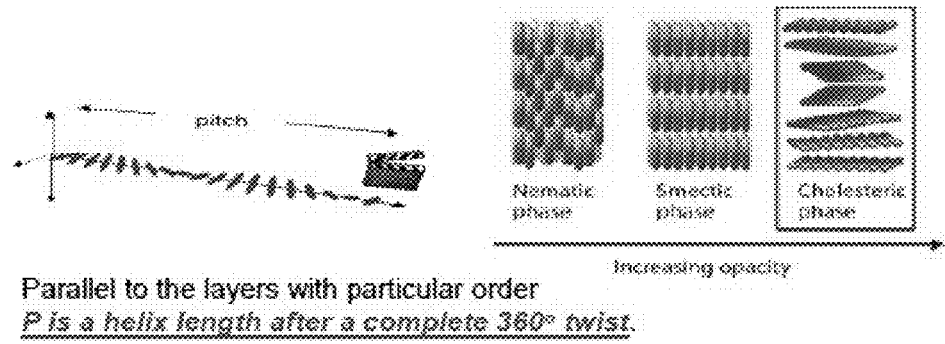

Parallel to the layers with particular order
*P is a helix length after a complete 360° twist.*

- CNC- Chiral nematic liquid crystalline behavior

FIG. 17

COTTON FIBER DISSOLUTION AND REGENERATION AND 3D PRINTING OF CELLULOSE BASED CONDUCTIVE COMPOSITES

CROSS-REFERENCE TO RELATED APPLICATIONS

This application claims priority to U.S. Provisional Application Ser. No. 62/256,837, filed Nov. 18, 2015, the entire contents of which are incorporated herein by reference.

TECHNICAL FIELD OF THE INVENTION

The present invention relates to the isolation of a cellulose and cellulose based conductive items fabricated by a 2D or 3D printing technique, and more particularly, to a 2D or 3D printing layer-by-layer conductive composite for photovoltaic applications and a 3D printing nonwoven composite for, e.g., electrical paper, conductive fabrics and biomedical uses.

STATEMENT OF FEDERALLY FUNDED RESEARCH

None.

BACKGROUND OF THE INVENTION

Cellulose is one of the most important biomass resources in the world. It is eco-friendly, biodegradable, sustainable and abundant. Cellulose is a very vital raw material in the industry and it has been broadly used in paper products, building materials, personal hygiene items, pharmaceuticals, and chemicals. However, it is rare to use cellulose as the major substrate in the electrical industry due to its nonconductive properties.

Cotton is an important natural resource for cellulose. As compared to other natural resources, cotton contains more than 90% cellulose which is much higher than wood cellulose (40%) while slightly lower than bacterial cellulose (92-98%) [1,2]. Cotton is also an important cash crop in the United States leading to the biggest cotton exportation in the world as well as a $25 billion-per-year industry in the country [3]. However, due to persistent increase of worldwide cotton production and substantial consumption of synthetic fibers, the market price of cotton as a raw material has been declining since 2009. Therefore, transforming cotton to value-added high-tech products is attracting tremendous interests.

The traditional application of cotton mostly serves the textile industry that rarely requires sophisticated processing to directly utilize raw cotton fibers. However, value-added or high-tech cotton derived products generally requires a pivotal step to effectively dissolve cotton cellulose. As compared to wood-derived cellulose, cotton-derived cellulose has a fairly high degree of polymerization (DP) of 9000-15000 with more than 66% crystallinity [4], which makes cotton-derived cellulose hard to dissolve in water and many organic solvents. The dissolution of cellulose is highly affected by its molecular weight and crystallinity [5]. Most researchers believe that the breakdown of the inter-chain hydrogen bonding of cellulose is the key to enhance its solubility [6]. Studies showed that solvents containing N-methylmorpholine-N-oxide (NMMO), ionic liquids (ILs), alkali/urea aqueous systems and metal salts (lithium chloride, LiCl)/N,N-dimethylacetamide (DMAc) solutions dissolve cellulose under different conditions [7,8]. However, most methods used to dissolve cellulose need rigorous conditions, such as long-term pretreatment, high temperature of 150° C., and high recycling cost [9-14].

Traditional conductive materials, such as noble metals like copper (Cu), silver (Ag) and gold (Au), are the major components used in energy, consumer electronics and semiconductor industry. They generally exhibit the best conductive properties. However, due to the high recycling cost and some defects in apparent mechanical properties such as folding or bending, new emerging materials are gradually showing better advantages. For example, carbon nanotubes (CNTs) and graphene oxide (GO) are two important conductive materials that have been used as fillers to reinforce polymer matrixes and enhance mechanical strength and electrical conductivity [15,16]. Recent studies reported on cellulose based composite materials using CNT or GO as fillers to obtain superior conductivity of the raw cellulose, which opens the possibility to extend the application of cellulose to high-tech electrical and energy industries [17-20]. Although the protocol for preparing these composites is quite easy (dissolving cellulose, mixing dispersed CNT or GO particles, and then perform film casting), making homogenous and well-designed products is difficult.

3D printing is a cutting-edge technology of great interests. It is capable of rapidly and accurately prototyping and patterning a material model in terms of various requirements [21]. To date, very few studies and almost no specific patents on pure cellulose composites with a fine structure prepared by 3D printing technology have been documented, especially for applications in electrical and energy industries. Markstedt et al. [22] reported a 3D-printing cellulosic products made of dissolved cellulose in an ionic liquid (IL) (1-ethyl-3-methylimidazolium acetate) and they proposed that the high concentration of cellulose in the solvent would assist in the printing process. Accordingly, 3D printing of dissolved cellulose combining compatible CNT or GO conductive ingredients to make a homogeneous conductive composite is feasible and deserves more studies.

SUMMARY OF THE INVENTION 3D printing cotton cellulose based conductive composites each comprised of a high concentration of pure cellulose and a conductive ingredient. An improved pretreatment of raw bleached cotton cellulose using freeze-drying, plasma activation, or acetic acid is applied to enhance the solubility and improve the viscosity of cellulose in order to optimize the 3D printing process. The conductive composites include a core ingredient that is a high concentration of pure cotton cellulose in an amount of 1-20% by weight or pure microcrystalline cellulose (MCC) in an amount of 5-50% to form a viscous fluid compatible for 3D printing. The conductive ingredient is CNT for making layer-by-layer photovoltaic items for solar cell application or GO for making a conductively nonwoven item for wearable application or biomedical information delivery. The conductive ingredient accounts for 1-15% content by weight in the conductive composites. The 3D prototyping of the conductive composites can be smartly designed by the computer program. Once the 3D printing is completed, an optimal regeneration of cellulose scaffolds in the distilled water, mild sulfuric acid and other solvent such as calcium chloride if alginate is used as one of ingredients in the conductive item to solidify cellulose composites. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

In one embodiment, the present invention also includes a method for dissolution and regeneration of cellulose comprising: suspending a cellulose or microcrystalline cellulose in an aqueous solution; freeze-drying or super-critical drying the cellulose or microcrystalline cellulose; re-suspending the cellulose or microcrystalline cellulose in a solvent at a temperature of 50° C. to 150° C. until the cellulose or microcrystalline cellulose is substantially dissolved or dissolving the cellulose or microcrystalline cellulose in a strong alkali/water solution; forming a gel by removing the solvent or the strong alkali/water solution to form a gel; and reconstituting the gel into the regenerated cellulose in water. In one aspect, the solvent is an alkali metal/organic solvent selected from dimethylformamide, dimethylacetamide, tetrahydrofuran, butoxyethanol, 1-propanol, methanol, ethanol, 2-propanol, acetone, dimethylsulfoxide, or sulfolane. In another aspect, the method further comprises the step of neutralizing the gel with an acid prior to reconstituting in water. In another aspect, the method further comprises the step of adjusting the viscosity of the gel with an ionic liquid or solvent. In another aspect, the method further comprises the step of forming the regenerated cellulose into a film, a fiber, spun into a yarn, a matrix, a mat, a mesh, or functionalized. In another aspect, the method further comprises the step of spinning or electrospinning the cellulose into a fiber. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite. In another aspect, the step of heating the cellulose or microcrystalline cellulose in the solvent to 80 to 120° C. with several 3-5 second pulses in a microwave oven.

In one embodiment, the present invention includes a cellulose-based conductive composite, comprising: a core matrix comprising a dissolved cellulose fiber or microcrystalline cellulose printed into a two or three dimensional pattern; a conductive material comprising a carbon nanotube or graphene oxide disposed on or about the cellulose fiber or microcrystalline cellulose; and an enhancer or stabilizer that stabilizes the dissolved cellulose or microcrystalline cellulose disrupted during a printing process, wherein the conductive material and the cellulose or microcrystalline cellulose forms one or more features in or on the cellulose fiber or microcrystalline cellulose. In one aspect, the cellulose is at an amount sufficient and a suitable viscosity for 3D printing. In another aspect, the concentration of pure cellulose samples is 1-20% of bleach cotton cellulose fiber with a Degree of Polymerization (DP) over 5,000, or 5-50% for microcrystalline cellulose with a DP of 200-250. In another aspect, the cellulose is freeze-dried prior to enhance the solubility of cellulose in a solvent. In another aspect, the cellulose is dissolved in a lithium chloride/dimethylacetamide (LiCl/DMAc) solvent system first mixed with DMAc at 80-90° C. for 20 mins., adding LiCl at a temperature of 80-90° C. for 2-4 hrs., cooling down to room temperature and then reheating to 80-90° C. until the cellulose mixture is clear. In another aspect, a Multiwall carbon nanotube (MWCNT) solution is separately placed in different ink boxes from the cellulose dissolved in a LiCl/DMAc solvent system, and cellulose/MWCNTs conductive composite is then printed layer-by-layer with a two-channel 3D printer. In another aspect, the graphene oxide (GO) solution is mixed with alginate to enhance the viscosity of GO solution, and the GO solution is transferred in different ink boxes with the cellulose dissolved in a LiCl/DMAc solvent system. In another aspect, the composite comprises a centered GO surrounded by cellulose that is printed by a two-channel 3D printer. In another aspect, a 4-8% NaOH/4-12% urea solvent system is used to dissolve the cellulose prior to printing. In another aspect, the composites comprise 1-10% GO mixed with cellulose dissolved in NaOH/urea solvent system and the mixture is stirred for at least 12 hrs. until it appears homogenous. In another aspect, the composites comprise 1-10% GO mixed with cellulose dissolved in NaOH/urea solvent system and the mixture is mounted in an ink box and printed by the 3D printer to form a membrane-like scaffold. In another aspect, the composite is formed into at least one of a photovoltaic cell, a solar cell, a conductive material for biological signal delivery, electrical paper, or conductive fabric. In another aspect, the 3D printing process enhancer is selected from at least one of alginate, gelatin, polyvinyl alcohol, or polylactide. In another aspect, the features are selected from at least one or more wires, transistors, resistors, capacitors, diodes, vias, Thin-Film Transistors (TFT), Random Access Memory (RAM), Static Random Access Memory (SRAM), FRAMs ferroelectric RAM (FRAM), pixels, Liquid Crystal Displays (LCD), Organic LED (OLED), a gate array or programmable read-only memory (PROM), N-type or P-type metal-oxide-semiconductor logic field effect transistors (MOSFETs), n-channel metal oxide semiconductors (NMOS), p-channel metal oxide semiconductors (PMOS), organic thin film transistors (OTFTs), batteries, energy storage, antennas, sensors, or plates. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

Another embodiment of the present invention includes a method for making a 3D printing cotton cellulose-based conductive composite, comprising: obtaining a core matrix comprising cellulose fibers or microcrystalline cellulose; dissolving the cellulose fibers or microcrystalline cellulose in a solvent; printing, layering or depositing the dissolved cellulose fibers or microcrystalline cellulose and a conductive material; and stabilizing the printed cellulose fibers or microcrystalline cellulose. In one aspect, the method further comprises the step of adding a 3D printing process enhancer to stabilize a cellulose disrupted during the printing process. In another aspect, the cellulose fiber or microcrystalline cellulose is freeze-dried before use. In another aspect, the conductive material is selected from at least one of a carbon nanotube or graphene oxide. In another aspect, the cellulose is at an amount sufficient and a viscosity for 3D printing. In another aspect, the concentration of pure cellulose samples is 1-20% of bleach cotton cellulose fiber with a Degree of Polymerization (DP) over 5,000, or 5-50% for microcrystalline cellulose with a DP of 200-250. In another aspect, the cellulose is freeze-dried prior to enhance the solubility of cellulose in the solvent. In another aspect, the cellulose is dissolved in a lithium chloride/dimethylacetamide (LiCl/DMAc) solvent system first mixed with DMAc at 80-90° C. for 20 mins., adding LiCl at a temperature of 80-90° C. for 2-4 hrs., cooling down to room temperature and then reheating to 80-90° C. until the cellulose mixture is clear. In another aspect, a carbon nanotube (CNT) solution is separately placed in different ink boxes from the cellulose dissolved in a LiCl/DMAc solvent system, and cellulose/MWCNTs conductive composite is then printed layer-by-layer with a two-channel 3D printer. In another aspect, the graphene oxide (GO) solution is mixed with alginate to enhance the viscosity of GO solution, and the GO solution is transferred in different ink boxes with the cellulose dissolved in a LiCl/DMAc solvent system. In another aspect, the composite comprises a centered GO surrounded by cellulose that is printed by a two-channel 3D printer. In another aspect, a 4-8% NaOH/4-12% urea solvent system is used to dissolve the cellulose prior to printing. In another aspect, the composites comprise 1-10% GO mixed with cellulose dissolved in NaOH/urea solvent system and the mixture is stirred for at least 12 hrs. until it appears homogenous. In another aspect, the composites comprise 1-10% GO mixed with cellulose dissolved in NaOH/urea solvent system and the mixture is mounted in an ink box and printed by the 3D printer to form a membrane-like scaffold. In another aspect, the composite is formed into at least one of a photovoltaic cell, a solar cell, a conductive material for biological signal delivery, electrical paper, or conductive fabric. In another aspect, the 3D printing process enhancer is selected from at least one of alginate, gelatin, polyvinyl alcohol, or polylactide. In another aspect, the features are selected from at least one or more wires, transistors, resistors, capacitors, diodes, vias, Thin-Film Transistors (TFT), Random Access Memory (RAM), Static Random Access Memory (SRAM), FRAMs ferroelectric RAM (FRAM), pixels, Liquid Crystal Displays (LCD), Organic LED (OLED), a gate array or programmable read-only memory (PROM), N-type or P-type metal-oxide-semiconductor logic field effect transistors (MOSFETs), n-channel metal oxide semiconductors (NMOS), p-channel metal oxide semiconductors (PMOS), organic thin film transistors (OTFTs), batteries, energy storage, antennas, sensors, or plates. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

Yet another embodiment of the present invention includes a system for making a conductive cellulose composite comprising: a two dimensional or three dimensional printer, comprising one or more printer cartridges, wherein the printer cartridges are loaded with a cellulose fiber or microcrystalline cellulose dissolved in a solvent; a processor connected to the printer capable of storing printing instructions for printing a two or three dimensional image; wherein the processor directs the printer to deposit the dissolved cellulose fiber or microcrystalline cellulose in a pattern or patterns; and a device or solution for stabilizing the printed cellulose fiber or microcrystalline cellulose. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

In one embodiment, the present invention includes a method of isolating nanocellulose comprising: obtaining a linter comprising cellulose; hydrolyzing the linter comprising cellulose with a strong acid into hydrolyzed cellulose; isolating the hydrolyzed cellulose by at least one of centrifugation or dialysis; mechanically disrupting the isolated hydrolyzed cellulose; filtering through at least two filters selected from 0.8 micron and 0.45 micron with a final filtration through a 0.22 micron filter; and retaining the cellulose microfiltrate obtained therefrom. In one aspect, the strong acid is selected from at least one of hydrochloric acid, sulfuric acid, nitric acid, perchloric acid, phosphorous acid, phosphoric acid, hypophosphorous acid, oxalic acid or acetic acid. In another aspect, the filtration step includes, in order, filtration with the 0.8 micron, the 0.45 micron, and finally the 0.22 micron filters. In another aspect, the step of hydrolyzing the cotton linter is defined further as comprising a temperature above room temperature. In another aspect, the step of hydrolyzing the cotton linter is defined further as comprising 40, 45 or 50° C. or greater, and 60, 90, 100, 120 mins. or greater. In another aspect, the linter is defined further as pure cotton linter comprising about 99% cellulose. In another aspect, the hydrolyzed cellulose is isolated in order by centrifugation and dialysis. In another aspect, the step of mechanically disrupting the isolated hydrolyzed cellulose is defined further as comprising sonication, ultrasonication, grinding, freeze-drying, or rapid temperature or pressure changes. In another aspect, the step of mechanically disrupting the isolated hydrolyzed cellulose is defined further as comprising ultrasonication at 500 W for 10 or more mins. In another aspect, the method further comprises the step of isolating the cellulose microfiltrate. In another aspect, the cellulose microfiltrate comprises an average particle size of less than 0.22 micron with a greater than 95% purity. In another aspect, the linter is obtained from cotton, wood pulp, switchgrass, yeast, or bacteria. In another aspect, the linter comprises short fibers that are not qualified for spinning to make yarns and cloth. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

Another embodiment of the present invention includes a method of isolating nanocellulose comprising: obtaining a cotton linter comprising cellulose; hydrolyzing the linter comprising cellulose with a strong acid into hydrolyzed cellulose; isolating the hydrolyzed cellulose by centrifugation and dialysis; mechanically disrupting the isolated hydrolyzed cellulose; filtering through at least two filters selected from 0.8 micron and 0.45 micron with a final filtration through a 0.22 micron filter; and retaining the cellulose microfiltrate obtained therefrom. In one aspect, strong acid is selected from at least one of hydrochloric acid, sulfuric acid, nitric acid, perchloric acid, phosphorous acid, phosphoric acid, hypophosphorous acid, oxalic acid or acetic acid. In another aspect, the filtration step includes, in order, filtration with the 0.8 micron, the 0.45 micron, and the 0.22 micron filters. In another aspect, the step of hydrolyzing the cotton linter is defined further as comprising a temperature above room temperature. In another aspect, the step of hydrolyzing the cotton linter is defined further as comprising 40, 45 or 50° C. or greater, and 60, 90, 100, 120 mins. or greater. In another aspect, the cotton linter is defined further as pure cotton linter comprising about 99% cellulose. In another aspect, the step of mechanically disrupting the isolated hydrolyzed cellulose is defined further as comprising sonication, ultrasonication, grinding, freeze-drying, or rapid temperature or pressure changes. In another aspect, the method further comprises the step of isolating the cellulose microfiltrate. In another aspect, the cellulose microfiltrate comprises an average particle size of less than 0.22 micron with a greater than 95% purity. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

Yet another embodiment of the present invention includes a method of isolating nanocellulose comprising: obtaining a pure cotton linter comprising cellulose; hydrolyzing the linter comprising cellulose with a strong acid into hydrolyzed cellulose at 40, 45 or 50° C. or greater, and 60, 90, 100, 120 mins. or greater; isolating the hydrolyzed cellulose by centrifugation and dialysis; ultrasonicating the isolated hydrolyzed cellulose; filtering through a 0.8 micron, then a 0.45 micron, and then with a 0.22 micron filter; and retaining the cellulose microfiltrate obtained therefrom. In another aspect, the cellulose or microcrystalline cellulose is selected from at least one of: cotton, wood, hemp, bacterial cellulose, microbial cellulose, tunicate, algae, or grass. In another aspect, the method further comprises the step of adding a biopolymer or chitin to the gel to form a cellulose-biopolymer or cellulose-chitin composite.

BRIEF DESCRIPTION OF THE DRAWINGS

For a more complete understanding of the features and advantages of the present invention, reference is now made to the detailed description of the invention along with the accompanying figures and in which:

FIGS. 4A to 4E show the various steps in a general protocol for 3D printing of cellulose composites of the present invention.

FIGS. 5A to 5C show the 3D printing process of a pure cellulose scaffold.

FIG. 6 shows the 3D printer with 3 channels for multilayer printing.

FIG. 16 shows a polarized microscopy-liquid crystalline behavior analysis comparing CNC without separation and CNC below 0.22 micron after the multistage separation.

FIG. 17 shows a summary of the cholesteric liquid crystal phase, showing a model of the chiral nematic liquid crystalline behavior of the isolated CNC.

DETAILED DESCRIPTION OF THE INVENTION

Figure 1A:
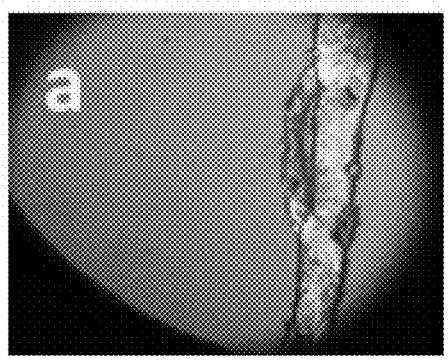
FIGS. 1A and 1B show polarized light microscopy photographs of 1.5% bleached cotton fiber without (FIG. 1A) and with (FIG. 1B) freeze-dried pretreatment dissolved in LiCl/DMAc (DP: 5300-5600 by GPC).

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein the term, "cellulose" and "cellulose substrate" refer to native cellulose from any source such trees, cotton, any vascular plant (angiosperms and gymnosperms), any non-vascular plant such as algae, mosses, liverworts, any animal that synthesizes cellulose (such as tunicates or sea squirts), any prokaryotic organism (such as cyanobacteria, purple bacteria, archaebacteria, etc.) The cellulose may be from an organism that has one or more cellulose synthase genes present. Furthermore, cellulose also includes any derivatized form of cellulose such as cellulose nitrate, cellulose acetate, carboxymethylcellulose, etc. Cellulose for use with the present invention includes any form of cellulose, such as native crystalline cellulose, which includes not only the native crystalline form (called cellulose I, in its alpha and beta sub allomorphs, all ratios, whether pure alpha or pure beta). Cellulose for use with the present invention also includes all processed crystalline celluloses, which deviates from the native form of cellulose I, such as cellulose II (which is a precipitated crystalline allomorph that is thermodynamically more stable than cellulose I). Further, cellulose for use herein includes all variations of molecular weights ranging from the lowest (oligosaccharides, 2-50 glucan monomers in a β-1,4 linkage to form a glucan chain), low molecular weight celluloses with a degree of polymerization (DP), which is the number of glucose molecules in the chain, from 5 to several hundred, on up to the highest DP celluloses known (e.g., 15,000 from some *Acetobacter* strains, to 25,000 from some algae). The present invention may also use all variations of non-crystalline cellulose, including but not limited to, nematic ordered cellulose (NOC).

Conductive materials for use with the present invention include, but are not limited to, metals, oxides, semiconductors, electrically conductive polymers, whether in the form of powders, wires, sheets, coatings, single-walled carbon nanotubes (functionalized or not), multi-walled carbon nanotubes (functionalized or not), and the like. The conductive materials can be in contact (via wires, vias, direct contact) or can create capacitance between two surfaces, can include or form resistance (or resistors), be used as input/output devices, can be used in displays with light emitting diodes or other lights, use conductive inks that change color with charge, temperature, pH, light, etc. The skilled artisan will recognize that the present invention can be used to print any number of materials into various different types of electronic devices, including Thin-Film Transistors (TFT), Random Access Memory (RAM), Static Random Access Memory (SRAM), FRAMs ferroelectric RAM (FRAM), pixels, Liquid Crystal Displays (LCD), Organic LED (OLED), a gate array or programmable read-only memory (PROM), N-type or P-type metal-oxide-semiconductor logic field effect transistors (MOSFETs), n-channel metal oxide semiconductors (NMOS), p-channel metal oxide semiconductors (PMOS), organic thin film transistors (OTFTs), batteries, energy storage, antennas, sensors, plates, and the like. Inorganic transistors can also be formed with the 3D printer that are non-single crystal, and that comprise semiconductor materials such as silicon, germanium, zinc oxide, zinc-tin oxide, or a combination thereof. Certain inorganic transistors and/or diodes can also be added that are amorphous (but may still be polycrystalline), III-VI diodes and transistors may also be used.

Non-limiting examples of different types of devices that can now be made using the present invention include, e.g., Thin-film batteries are described for example, in U.S. Pat. No. 7,056,620, "Thin film battery and method of manufacture" to Krasnov et al, and U.S. Pat. No. 6,962,613 "Low-temperature fabrication of thin-film energy-storage devices" to Jenson (which notes a flexible substrate), Fusible link memory circuitry is described in U.S. Pat. No. 5,412,593 "Fuse and antifuse reprogrammable link for integrated circuits" to Magel and Stoltz, TFTs for use in displays include U.S. Pat. No. 6,952,021 "Thin-film transistor and method for making the same" by Tanaka, et al. with an inorganic transistor, and U.S. Pat. No. 6,784,452 "Organic thin film transistor" by Toguchi, et al., antennas can also be used to collect energy, (see U.S. Pat. No. 5,053,774 "Transponder arrangement" to Schuermann, et al., organic PMOS devices and inorganic NMOS devices can be made by different processes and then combined into an electronic textile. FRAM circuits with OLEDs are mentioned is U.S. Pat. No. 6,972,526 by Abe; U.S. Pat. No. 6,563,480 by Nakamura; and U.S. Pat. No. 6,872,969 by Redecker. FRAM circuits with liquid crystal displays (LCDs) are mentioned in U.S. Pat. No. 6,819,310 by Huang, et al.; U.S. Pat. No. 6,747,623 by Koyama; U.S. Pat. No. 6,850,217 by Huang, et al.; and U.S. Pat. No. 6,563,483 by Sakumoto, and U.S. Pat. No. 8,404,527 "Electronic textiles with electronic devices on ribbons" to Gnade. Relevant portions of each of the above references are incorporated herein by reference.

Briefly, the present invention includes three-dimensional (3D) printing cotton cellulose-based conductive composites are composed of a pure cotton cellulose fibers and conductive ingredients. In certain embodiments, the 3D printing cotton cellulose based conductive composites comprise a high concentration of pure cellulose ingredients, a conductive ingredient, and an assistant of enhancing the 3D printing efficacy. A high concentration of pure cellulose can be used to conform to the requirement of 3D printing that needs a highly viscous fluid. Surprisingly, it has been found that the dissolution of high concentration of pure cellulose is improved by the freeze-drying treatment or acetic acid treatment. The 3D printing layer-by-layer cellulose/MW-CNTs conductive composite is prepared by dissolving cellulose in LiCl/dimethylacetamide (DMAc) and printing cellulose dissolution and multi-walled carbon nanotubes (MWCNTs) in the single-channel 3D printer. The present invention can be used for photovoltaic applications, such as, solar cells.

The 3D printing cellulose/graphene oxide (GO) chip-like membrane scaffold can also be prepared by cellulose dissolution in LiCl/DMAc and GO solution mixing with a printing enhancer, e.g., alginate. The cellulose/graphene oxide (GO) chip-like membrane scaffold can be printed by the two channel 3D printer and can include a conductive material for, e.g., biological signal delivery. The 3D printing cellulose/GO membrane-like scaffold can also be prepared by cellulose dissolution in NaOH/urea mixing with GO powder and printing in the single-channel 3D printer, and can be used in, e.g., electrical paper, or conductive fabric.

Materials that can now be made with the present invention include composites (conductive products, consumer electronics, consumer products, etc.) or components used to make composite (cotton-based cellulose, titanium dioxide, graphene oxide, etc.). The skilled artisan will recognize that many different solvent systems can be used to (either lithium chloride/DMAc, ionic liquid, etc.) dissolve cellulose, e.g., cellulose from plant sources (such as cotton), or other sources of cellulose, natural or engineered.

The present inventors found that, surprisingly, a freeze-drying pretreatment of the cellulose led to significant changes in the characteristics of the cellulose once dissolved. It was found that the freeze-drying pretreatment remarkably increases the viscosity of cellulose dissolution that would make the cellulose-based materials qualified for the requirement of the 3D printing process. Non-limiting examples of cellulose that benefits from the pre-treatment include, but are not limited to, raw cotton linter, microcrystalline cellulose (MCC) or cellulose nanocrystals (CNC). Using the present invention, MCC and CNC are much easier to dissolve than raw cotton-based cellulose as they show much lower molecular weight (MW) and lower degree of polymerization (DP, around 150-300) than raw cotton-based cellulose (DP: 3000-5000 after scouring and bleaching of raw cotton linter). In addition, 3D printing technology generally requires high viscosity, homogenous material phase to accomplish 3D printing work. In terms of the precision and complexity of cellulose-based products printed using the present invention, the complete printing time varies from half an hour to half a day. The current technology of dissolution can also make a viscous solution by using high percentage of cellulose raw material, whereas such a viscous solution is an inhomogeneous system where most cellulosic macromolecules are swollen or dispersive in the solvent rather than a true dissolution. The inhomogeneous cellulose dissolution, if it stays in the 3D printer ink box for a long time, leads to the separation between cellulosic macromolecules and solvent used. As a result, the end product after printing is not a good homogeneous material and the expected properties are impaired.

A further advantage of the present invention is that for the first time 2D and 3D printing technology can be used to make cotton-based cellulose conductive composites. Until now, the challenge of printing with cellulose was that the dissolved raw cellulose, as a result of viscosity and loss of homogeneity, led to unsatisfactory printing results. Due to the increase in the fidelity achieved with the present invention, a user is now able to easily achieve a micro-chip pattern of cellulose-based product by using 3D printing. In one non-limiting example, a 3D printer assembled by two ink boxes was used, one containing dissolved cellulose and the second a conductive material (e.g., a graphene oxide dispersion). While the printing can be controlled manually, any computer program for graphic design can now be used to drive the ink boxes to print a graphene oxide-centered cellulose film or membrane. Additionally, other examples of using 3D printing technology would be also related to such a smart design, such as layer-by-layer configuration for multifunctional application, stripy design for iridescent application, and so on, using the present invention.

The following are certain, non-limiting, exemplary compositions and methods for use with the present invention. Scoured and bleached cotton cellulose with a DP over 5000 or MCC with a DP of 200-250 is first freeze-dried using a Labconco FreeZone 4.5 L Freeze Dry system. Samples are frozen in a −20° C. freezer for 2-12 hrs., and then freeze-dried in the freeze-dryer. Next, 1-20% freeze-dried cotton cellulose or 5-50% freeze-dried microcrystalline cellulose (MCC) is added in 50-100 mL of dimethylacetamide (DMAc). The temperature is increased from room temperature to 80-90° C. and maintained at 80° C. for 10-30 mins. Four to five grams of LiCl is slowly added to cellulose/DMAc mixture. The temperature is maintained at 80-90° C. with stirring for 2-4 hrs. The cellulose/solvent system is then cooled down to room temperature for 2-12 hrs., and the temperature is increased to 80-90° C. until the cellulose/solvent system is clear.

Figure 1B:
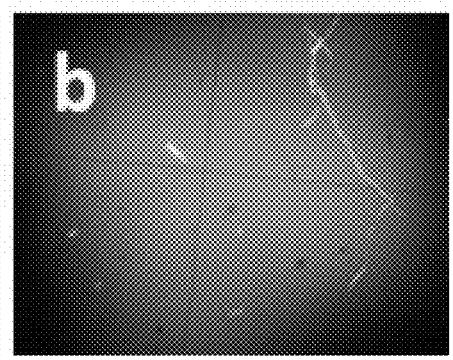
Figure 2:
FIG. 2 shows the excellent mechanical properties of cellulose film prepared from 5% freeze-dried microcrystalline cellulose (MCC) (DP: 200-250 by GPC) in LiCl/DMAc showing bending, compressing, stretching and folding properties.
Figure 3A:
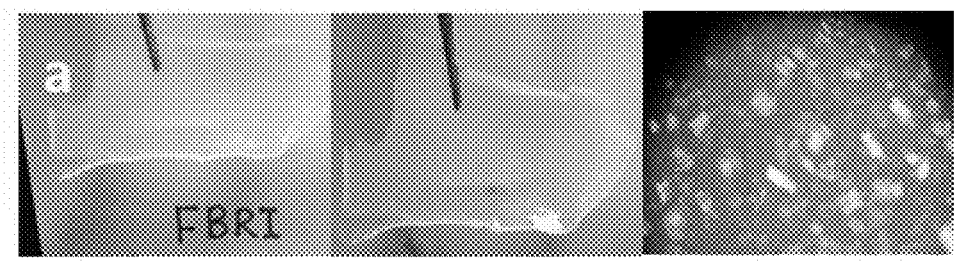
FIGS. 3A and 3B show: 10% MCC (DP: 200-250 by GPC) without (FIG. 3A) and with (FIG. 3B), freeze-dried pretreatment dissolved in LiCl/DMAc showing transparency (left and middle) and photographs under polarized light microscope (right), respectively.
Figure 3B:
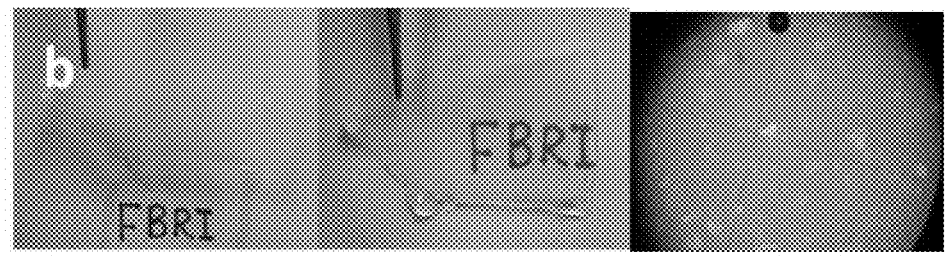

Under the polarized-light microscope, a few small fibers in the cellulose film with freeze-drying pretreatment can be observed. However, long fibers remained in samples without freeze-drying pretreatment (FIGS. 1A and 1B). Meanwhile, the heating temperature is reduced to 80-90° C. from 100-150° C. as compared to reports from most references. The casting of films prepared from five to ten percent of freeze-dried MCC dissolved in LiCl/DMAc show very good transparency (FIGS. 3A and 3B), excellent flexibility and strength (FIG. 2).

Other solvents such as 4-8% NaOH/4-12% urea (w/v) or ILs can be used to make 3D printing fluids of cellulose. After freeze-drying, the raw cotton cellulose and MCC samples, 1-20% of cotton cellulose and 5-50% MCC, are dissolved in the 4-8% NaOH/4-12% urea solvent system in an ice-bath until a milky gel-like solution is obtained. The solution mixture is placed in a −20° C. freezer overnight and taken out to defreeze and stir until it is melted.

Figures 4A, 4B, 4D, 4E:
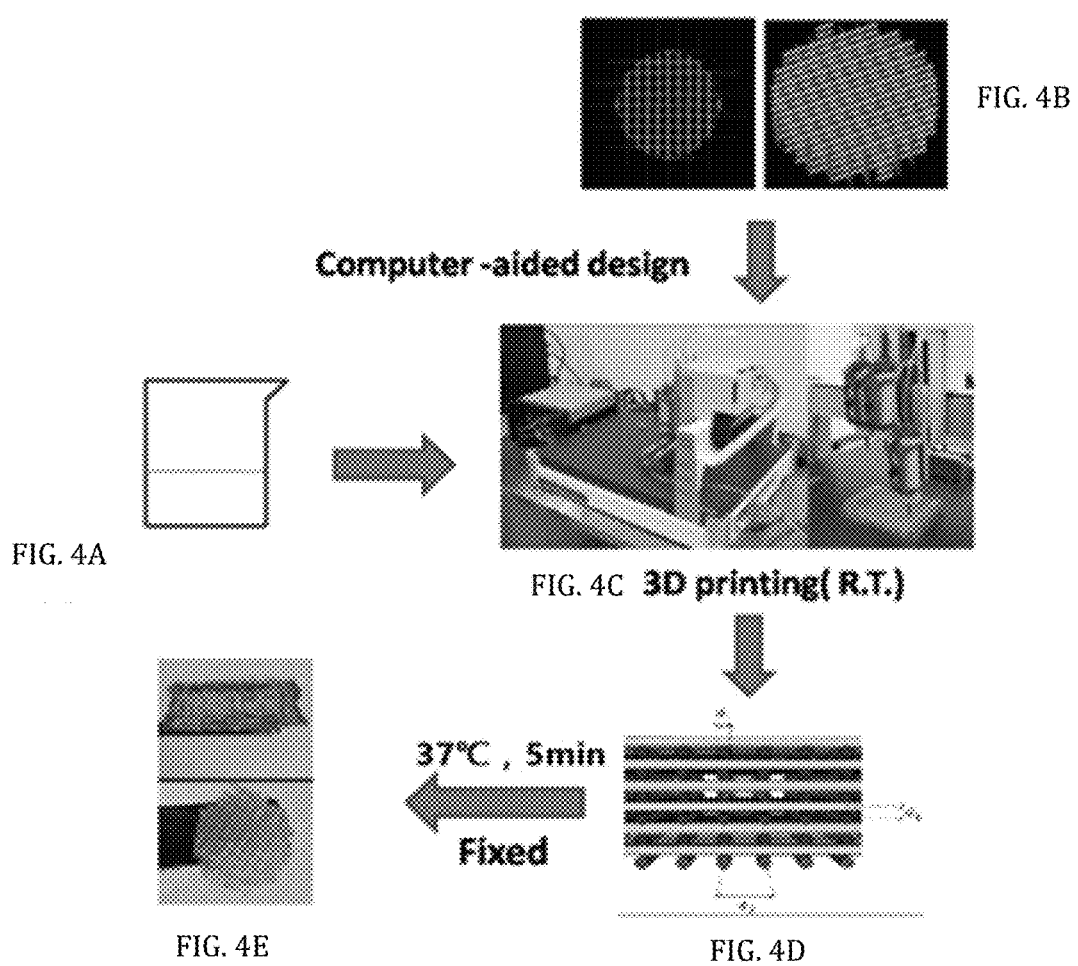

FIGS. 4A to 4E represent a general protocol for 3D printing. The first step of 3D printing is to design the scaffold using computer software (FIG. 4B). The 3D printing fluids (FIG. 4A) are transferred to printer ink boxes (FIG. 4C) according to the printing requirements. After running the designed 3D printing program, the 3D scaffold obtained (FIG. 4D) is fixed in regeneration solvents (water, sulfuric acid, calcium chloride) or by other methods, such as freeze-drying, vacuum drying or sintering to yield the cellulose composite shown in FIG. 4E.

Example 1: 3D Printing of Pure Cotton Cellulose in Alkaline Solvent System

An amount of 33.3 wt % freeze-dried MCC (5 g) is dissolved in 6 wt % NaOH/4 wt % urea solvent system containing 1.2 g NaOH and 0.8 g urea dissolved in 8 mL DI water. The MCC is mixed in this solvent systems stirring in an ice-bath until it looks like a milky gel-like solution (FIG. 5A). The milky solution is placed in −20° C. freezer overnight and taken out to defreeze until it is melted. Next, the melted solution is transferred in the ink box of 3D printer to perform 3D printing at the designed pressure 50-60 kPa and the size of cubic shape with 10×10×5 mm until the scaffold is formed (FIGS. 5B-5C). The cellulose scaffold is immediately placed in the regeneration solution, 1-5% sulfuric acid for 2-5 hrs. The freeze-drying operation is applied to the fixed cellulose scaffold to obtain dehydrated sample with an intact scaffolding shape.

Example 2: 3D Printing of Cotton Cellulose/Alginate Composite in Lithium Chloride/Dimethylacetamide (LiCl/DMAc) Solvent System An amount of 3% freeze-dried cotton cellulose fiber (5 g) is dissolved in 8% LiCl/DMAc solvent system containing 8 g LiCl dissolved in 100 mL DMAc. Cotton cellulose fiber is first mixed with DMAc and pre-heated at 80° C. for 20 mins. The amount of LiCl is subsequently added to this mixture and the dissolution is maintained at 80° C. for 2 hrs. The cellulose mixture is cooled down to room temperature within 2 hrs. and then reheated to 80° C. until the mixture is clear. If the mixture still looks turbid, the cooling and reheating steps are repeated 2-3 times until a transparent solution is obtained. The transparent solution is mixed with 1-2% alginate and reheated to 100° C. for 2-4 hrs. until the alginate is dissolved. The resultant solution is transferred to the ink box of 3D printer to perform 3D printing at the designed pressure 50-60 kPa and the size of cubic shape with 10×10×5 mm until the scaffold is formed. The cellulose/alginate scaffold is immediately placed in 0.1 mol/L calcium chloride to be fixed for 2-12 hrs. The freeze-drying operation is applied to the fixed cellulose scaffold to obtain dehydrated sample with an intact scaffolding shape.

Example 3: 3D Printing of Cellulose/CNT Conductive Composite

Figure 7:
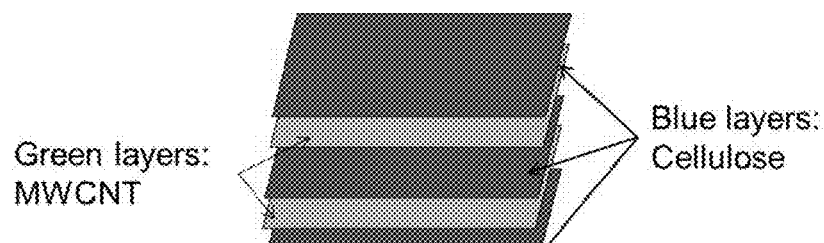
FIG. 7 shows a layer-by-layer structure of cellulose/MWCNT conductive composite prepared by two-channel 3D printing.

An amount of 3% freeze-dried cotton cellulose or 15% freeze-dried MCC is dissolved in 8% LiCl/DMAc solvent system containing 8 g LiCl dissolved in 100 mL DMAc. The dissolution of cellulose or MCC is referred to [0014] example 2. Multiwall carbon nanotubes (MWCNTs) with an amount of 1-10% by weight of cellulose samples is mixed with ethyl methylimidazolium acetate (EMIAc) and stirred until the mixture looks homogenous. Cellulose dissolution and MWCNTs solution are transferred to different ink boxes in the 3D printer with three channels (FIG. 6). The printing program is designed as a layer-by-layer step with 2 mm thick cellulose layer and 0.1 mm thick MWCNTs layer. The two layers are gradually and alternatively attached until a 5 mm thick scaffold is formed. The resultant scaffold is placed in distilled water until most of LiCl/DMAc and EMIAc are removed. The hydrated cellulose/MWCNT 3D printing scaffold is freeze-dried and ready for conductive uses (FIG. 7). FIG. 7 shows a layer-by-layer structure of cellulose/MWCNT conductive composite prepared by two-channel 3D printing.

Example 4: 3D Printing of Cellulose/Graphene Oxide (GO) Conductive Composite

An amount of 33.3 wt % freeze-dried MCC (5 g) or 5% freeze-dried cotton cellulose fiber is dissolved in 8 wt %

NaOH/12 wt % urea solvent system containing 4 g NaOH and 6 g urea dissolved in 40 mL DI water. The dissolution of samples is referred to in Example 1, and the samples are dissolved until the melted solution is obtained. GO can be prepared, e.g., through an acid oxidation of graphite flake [23, 24]. The dispersion of GO with a concentration of 0.1-0.5 mg/mL in the distilled water is prepared by ultrasonication of GO powder for 1 hr. Next, the cellulose dissolution is mixed with GO dispersion stirring at room temperature for overnight until it looks homogenous and sticky. The cellulose/GO mixture is transferred in the ink box of 3D printer to perform 3D printing at the designed pressure 50-60 kPa and the pattern of membrane-like scaffold with only 0.1-0.5 mm thick. The cellulose/GO composite scaffold is immediately placed in the regeneration solution, 1-5% sulfuric acid for 2-5 hrs., until the scaffold is fixed. The freeze-drying operation is applied to the cellulose/GO scaffold to obtain dehydrated sample with an intact scaffolding shape.

Figure 8:
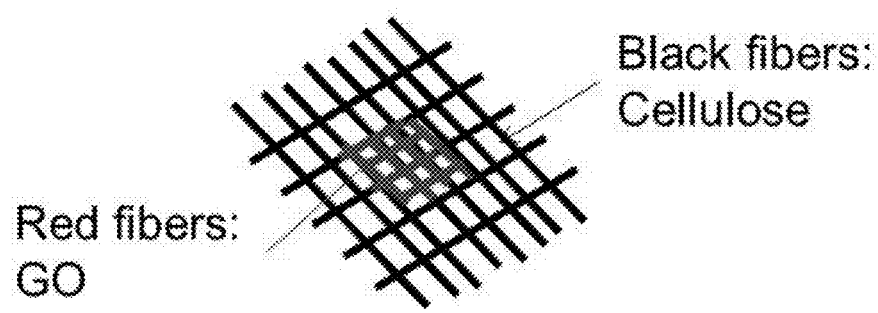
FIG. 8 shows a chip-like membrane scaffold with GO centered surrounded by cellulose.

In Example 4, if the solvent system for cellulose is LiCl/DMAc, the protocol to dissolve cellulose sample follows example 2. The GO is first dispersed in the distilled water in which the alginate is then added to enhance the viscosity of GO dispersion. Cellulose dissolution and GO dispersion are transferred in the ink boxes of the 3D printer as shown in FIG. 6. The program is designed to print a chip-like membrane scaffold with an aggregated GO in the center surrounded by cellulose. The resultant cellulose/GO scaffold is freeze-dried and ready for potential use of biological signal delivery (FIG. 8).

Example 5. Cellulose Processing

Cellulose nanocrystals can be derived from acid hydrolysis, which has been well studied. Cellulose nanocrystals show a fairly wide range of particle sizes from 20 nm to 2000 nm. It is interesting that no research or report has released an idea or a method to classify cellulose nanocrystals upon the size differences. In this work, the present inventors have used a separate strategy of multistage microfiltration to successfully obtain different cellulose nanocrystals in specific size ranges. For example, more than 96% of cellulose nanocrystals after separation could be concentrated in the range of 50-220 nm. The almost uniform cellulose nanocrystals with a specific particle size of 50-220 nm have shown a significant transition of morphological profile and an unique liquid crystal behavior as compared to original cellulose nanocrystals without separation. Such cellulose nanocrystals with an approximately uniform size would have a great potential for applications as fiber-reinforcement and high-tech digital display technology.

Cellulose nanocrystals are derived from cellulose by acid hydrolysis. Particle size distribution of cellulose nanocrystals derived from different sources of cellulose are in a wide range from 20 nm to >1000 nm. No protocol or report has been released to separate cellulose nanocrystals with specific size ranges. In this disclosure, the present inventors have used multistage separation strategy to successfully obtain cellulose nanocrystals in different size ranges. Such cellulose nanocrystals with uniform sizes show unique properties as compared to original cellulose nanocrystals without separation.

The present inventors developed a novel process for the separation of cellulose nanocrystals via multistage microfiltraion strategy and the results show that different cellulose nanocrystals in specific size ranges can be successfully obtained. For example, the particles size for cellulose nanocrystals without separation generally varies from 20 nm –1000 nm, while more than 96% of cellulose nanocrystals in the range of 50-220 nm can be concentrated. The novel method of separation can also be used to make bio-based value-added products from cotton fibers. The cellulose nanocrystals obtained after separation have high potential to be used as an unique liquid crystal material in the high-tech digital display technology or they can be functionalized for biomedical applications.

Currently, cellulose nanocrystals (CNC) are derived from cellulose by acid hydrolysis, and the particle size distribution of these nanocrystals ranges from 20 nm to 1000 nm. Significant research has not been conducted on the separation of cellulose nanocrystals into specific size ranges. This invention for the first time separates cellulose nanocrystals by multistage microfiltration.

It was found that this novel separation strategy can be used to make uniform sized crystals for use in bio-based value-added products from cotton fibers. The nanocrystals obtained after separation, have great potential to be used as an unique liquid crystal material in high-tech digital display technology, or could be functionalized for biomedical applications.

From raw cotton linter, i.e., the waste that is not qualified for spinning to make yarns and cloth, the inventors were able to obtain cellulose after a simple process of scouring and bleaching. From here, there is sulfuric acid hydrolysis followed by centrifugation and dialysis. The former process is common in the fiber and biopolymer industry. The novel methodology disclosed takes this product, following ultrasonication, and sends it through a series of multistage microfiltration. Specifically, three steps: 0.80 µm, 0.45 µm, and 0.22 µm in series. The precipitate is collected and a CNC suspension results containing only CNC <0.22 µm. Without ultra or microfiltration, CNC particle size distribution is 20 nm to >1000 nm.

The product of the present invention is one that has improved chemical and physical properties and also a variation of liquid crystalline behavior. For example, in CNC below 0.22 µm, hydrogen bonding significantly decreased. Also crystallinity decreases as CNC size is decreased. Moreover, CNC below 0.22 µm had more random morphology, more weight loss, and lower transition temperature as compared to CNC without separation. The inventor's future objectives are to determine property variances of CNC concentrate at different size ranges (>0.80 µm, 0.45-0.80 µm, 0.22-0.45 µm). At this time the differences, if any, are not known for the subsets of size ranges.

Figure 9:
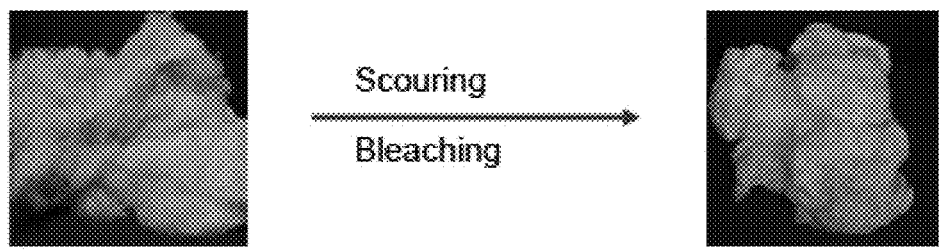
FIG. 9 shows a comparison of raw cotton linter and pure cotton linter.

FIG. 9 shows a comparison of raw cotton linter and pure cotton linter. In the first step of the present invention, a pure cotton linter (cellulose content of about 99%) is obtained by, e.g., scouring or bleaching, raw cotton linter with an approximate cellulose content of 90%. Cotton linter waste is generally those short fibers that are not qualified for spinning to make yarns and cloth. Next, the pure cotton linter is treated by sulfuric acid hydrolysis. In one non-limiting example, the pure cotton linter is treated with 63.5% sulfuric acid, and the hydrolysis is conducted for 90 mins. at 40° C. The skilled artisan will know how to modify these parameters to achieve hydrolyzed or dissolved cellulose. The hydrolyzed or dissolved cellulose is then isolated by centrifugation and/or dialysis. The product of the centrifugation and/or dialysis is then ultrasonicated. The ultrasonication may be conducted at, e.g., 500 W for 10 mins. at an amplitude of 50%. Finally, the product obtained thereby is subjected to ultrafiltration as described next.

Figure 10:
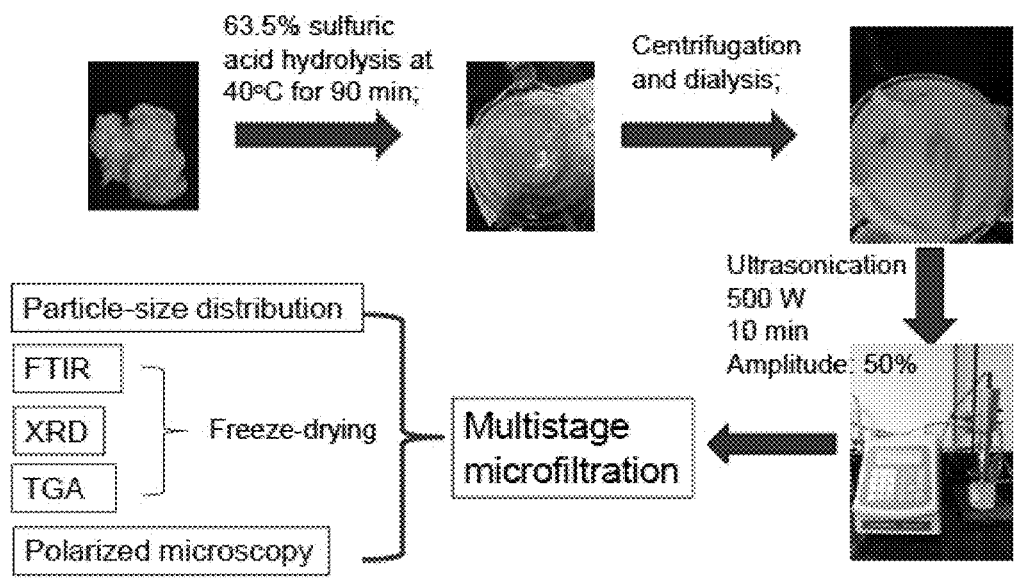
FIG. 10 shows a flow-chart with the initial steps of the present invention.
Figure 11:
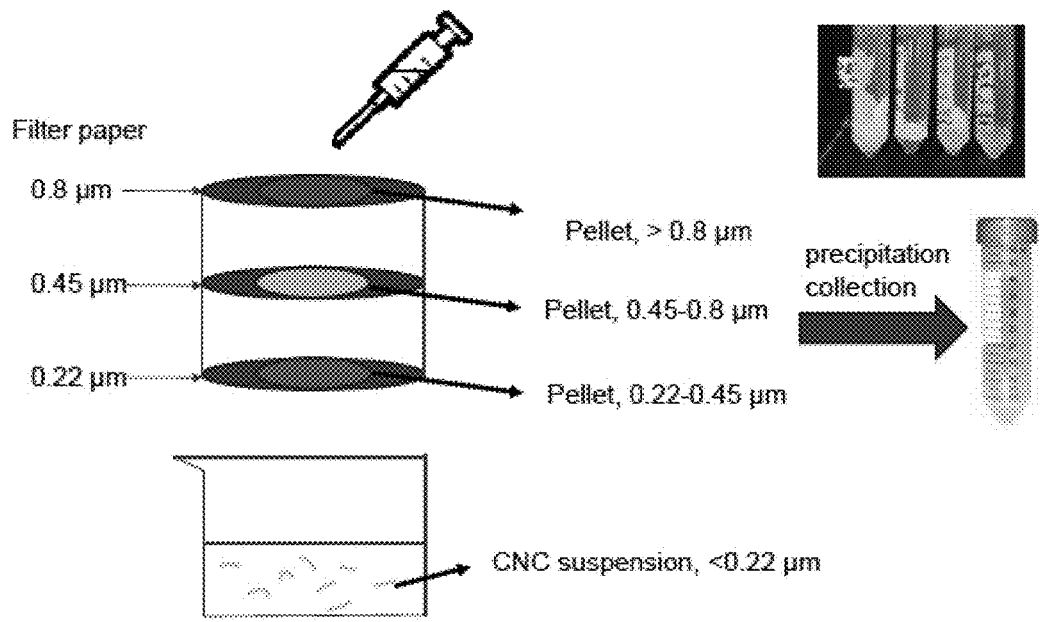
FIG. 11 shows the multistage microfiltration steps of the crystalline nanocellulose (CNC).

FIG. 10 shows a flow-chart with the initial steps of the present invention. First, the ultrasonicated cellulose is passed through a 0.8 micron filter, with the retentate having a size of greater than 0.8 micron size, and the filtrate subjected to additional filtration. Next, the filtrate is passed through a 0.45 micron filter, with the retentate having a size from 0.45 to 0.8 micron, and the filtrate is subjected to an additional filtration step. The filtrate is next passed through a 0.22 micron filter, with the retentate having a size from 0.22 to 45 microns, and the filtrate having a size of less than 0.22 microns. The 0.22 micron filtrate comprises a suspension of cellulose nanoparticles with a size of less than 0.22 microns. FIG. 11 shows the multistage microfiltration steps of the crystalline nanocellulose (CNC).

TABLE 1

Percentage of Particles in Different Size Ranges.

| | Percentage of particles in different size ranges | | | |
|---|---|---|---|---|
| | >0.8 µm (%) | 0.45-0.8 µm (%) | 0.22-0.45 µm (%) | <0.22 µm (%) |
| Original CNC | 1.35 | 4.86 | 11.26 | 82.54 |
| CNC particle-size >0.8 µm | 26.34 | 39.99 | 10.53 | 29.20 |
| CNC particle-size 0.45-0.8 µm | 6.29 | 54.03 | 22.94 | 16.74 |
| CNC particle-size 0.22-0.45 µm | 0.25 | 3.51 | 15.62 | 80.62 |
| CNC particle-size <0.22 µm | 0 | 0 | 4.32 | 95.68 |

CNC particle size below 0.22 µm is 95.68% after multistage separation

Pick CNC particle size in the ranges of below 0.22 µm for the next experiments

Original CNC in a wide-size range can be separated by the means of multistage microfiltration. The crystallinity was significantly reduced from original CNC to CNC size below 0.22 µm after multistage separation demonstrated by FTIR, XRD and TGA.

CNC showed a chiral nematic phase behavior for the original CNC and CNC below 0.22 µm, while P value was increased for small CNC. The decrease of crystallinity could be highly related to the concentration increase of small CNC that probably exposed more amorphous areas after separation. This transition of liquid crystalline behavior may be related to the transformation from anisotropic phases to isotropic phases, which is associated with the change from crystalline morphology to amorphous morphology.

Figure 12:
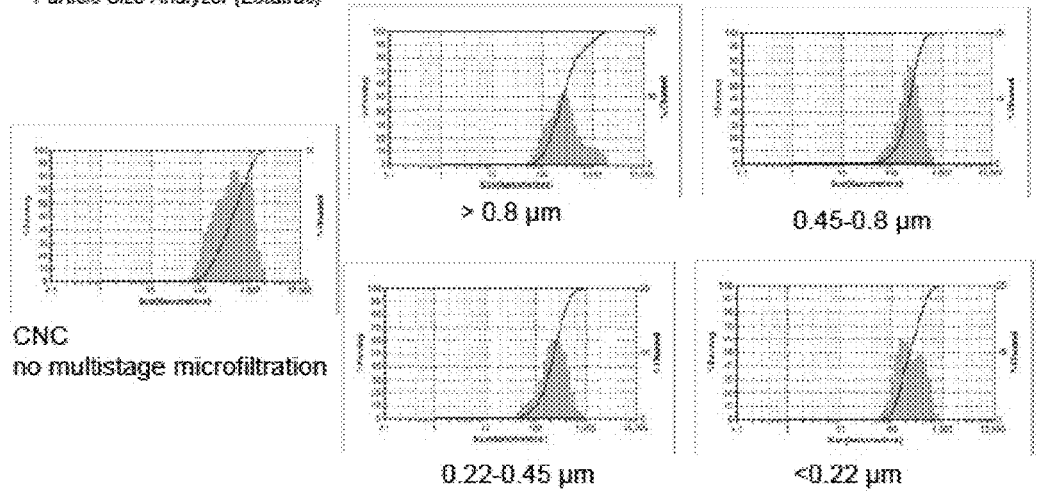
FIG. 12 shows the particle size distribution of the CNC before and after multistage filtration.
Figure 13:
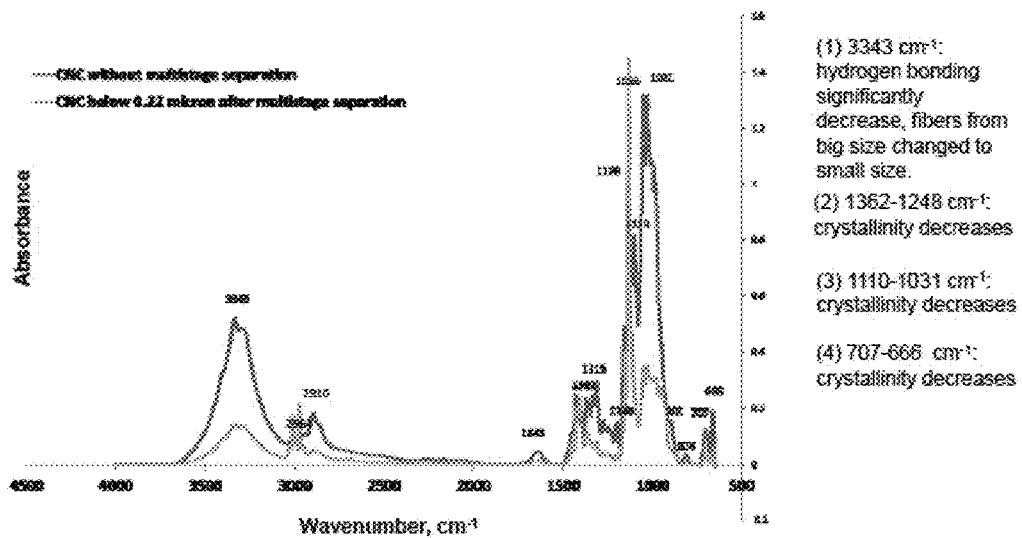
FIG. 13 shows FTIR spectroscopy of the CNC, 4000-650 $cm^{-1}$, 4 $cm^{-1}$ resolution, comparing CNC without separation and CNC below 0.22 micron after the multistage separation.
Figure 14:
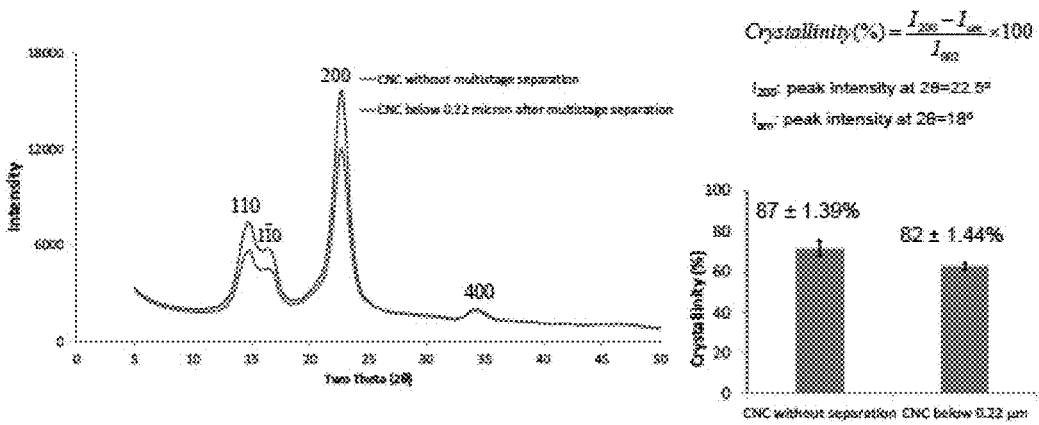
FIG. 14 shows X-ray diffraction of the CNC, 5-50 degree comparing CNC without separation and CNC below 0.22 micron after the multistage separation.
Figure 15:
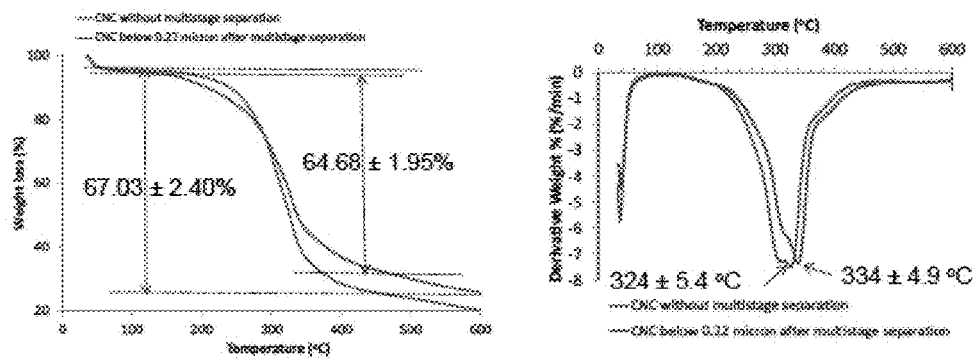
FIG. 15 shows a thermogravimetric analysis comparing CNC without separation and CNC below 0.22 micron after the multistage separation.
Figure 18:
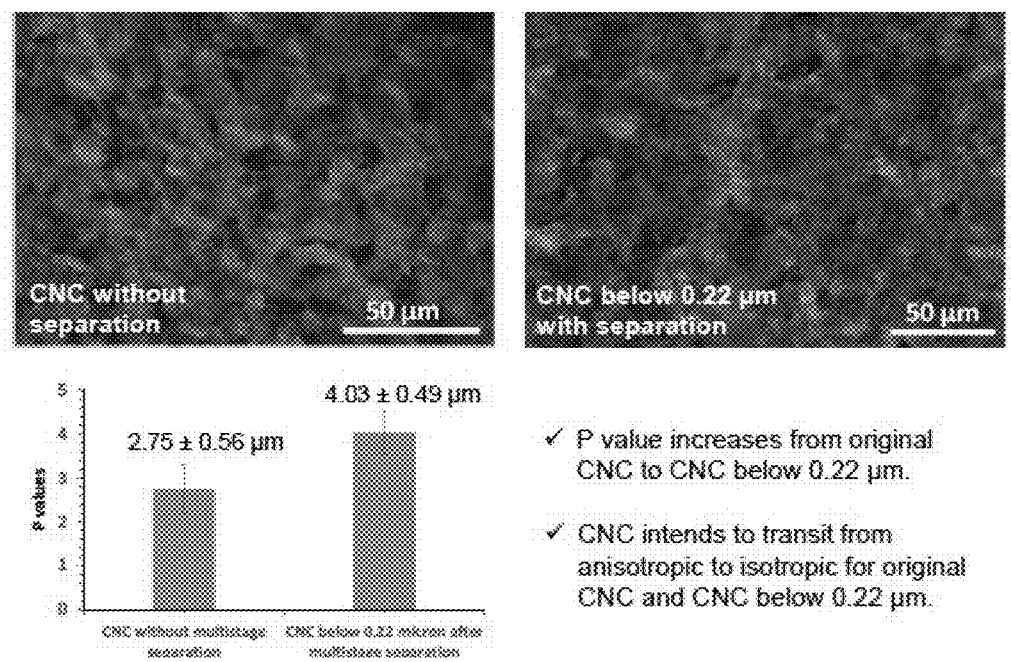
FIG. 18 shows CNC without separation and CNC below 0.22 micron after the multistage separation, in which there is a P value increase from the original CNC to CNC below 0.22 microns.

FIG. 12 shows the particle size distribution of the CNC before and after multistage filtration. FIG. 13 shows FTIR spectroscopy of the CNC, 4000-650 cm$^{-1}$, 4 cm$^{-1}$ resolution, comparing CNC without separation and CNC below 0.22 micron after the multistage separation. FIG. 14 shows X-ray diffraction of the CNC, 5-50 degree comparing CNC without separation and CNC below 0.22 micron after the multistage separation. FIG. 15 shows a thermogravimetric analysis comparing CNC without separation and CNC below 0.22 micron after the multistage separation. FIG. 16 shows a polarized microscopy-liquid crystalline behavior analysis comparing CNC without separation and CNC below 0.22 micron after the multistage separation. FIG. 17 shows a summary of the cholesteric liquid crystal phase. FIG. 18 shows CNC without separation and CNC below 0.22 micron after the multistage separation, in which there is a P value increase from the original CNC to CNC below 0.22 microns.

With a controlled size, the cellulose nanoparticles can be functionalized by, e.g., external magnetic field alignment, electrical field alignment; chemical or physical surface modification to impart innovative properties.

Example 6. Cotton Fiber Dissolution and Regeneration to Produce Various Materials Materials. Cotton fibers or microcrystalline cellulose is first suspended in deionized (DI) water and stirred overnight. The cellulose suspension is then frozen in a freezer for at least 2 hrs., during which the cellulose suspension is shaken every 5 min. The cellulose suspension can also be frozen in liquid nitrogen for at least 10 min. Next, the frozen sample is dehydrated in Freeze Dryer (such as FreeZone R Plus, Freeze Dry Systems, Labconco) until the sample is completely dry. Freeze-dried (FD) is immediately used for dissolution without further treatment.

Pretreatment can also include, acetic acid treatment, ethanol treatment. These treatments have shown to enhance the dissolution of cotton cellulose Dissolution. Solvent: lithium chloride/dimethylacetamide (LiCl/DMAc): Freeze-dried (FD) cellulose specimens were first suspended in DMAc at concentrations ranging from 1 to 15% (w:v) and suspensions were heated at high temperatures ranging from 60° C. to 150° C., e.g., 70, 80, 85, or 90°, under stirring for periods of time ranging from 30 min to 60 min, e.g., 35, 40, 45, or 55 min. Oven-dried LiCl powder (3 g to 15 g) was added to the cellulose suspension and the whole cellulose mixture was heated at temperatures ranging from 60° C. to 150° C. for another 1 hr. to 3 hrs. At the end of the heating, the temperature was decreased to temperatures ranging from 50° C. to room temperature and maintained at the selected temperature for overnight or until cellulose has completely dissolved. Complete cellulose dissolution can be achieved in 24 hrs.

Solvent: NaOH: FD Cellulose is dissolved in a strong alkali/water system such as NaOH/water, NaOH/urea solvent at different concentrations. The alkali (e.g., NaOH) is first dissolved in deionized (DI) water and precooled at lower temperatures ranging –5° C. to –20° C. for 1 hr. to 3 hrs. and cellulose is dispersed in DI water and stirred at low temperatures ranging between 0° C. to 10° C. for periods of time ranging from 1 hr. to 3 hrs. The skilled artisan will recognize that other alkalis may be substituted for the NaOH, such as Lithium hydroxide (LiOH), Potassium hydroxide (KOH), Rubidium hydroxide (RbOH), Cesium hydroxide (CsOH), or equivalents thereof. Next, the cellulose/water solution is mixed with the alkali (e.g. NaOH) solution and the mixture is placed in a freezer set to –5° to –20° C. The mixture is stirred to homogenize the mixture for at least 1 hr. The resultant cellulose/alkali/water mixture is transferred to cylindrical molds and placed in an oven maintained at temperatures ranging from 30° C. to 60° C. for at least 2 hrs. or until a gel is formed. The gels are then regenerated in distilled water, neutralized with diluted acid (such as 0.1 M $H_2SO_4$) and rinsed with DI water to remove the acid. The solvent exchange of gels with pure acetone was performed to ensure complete replacement of water with acetone (this process can often take at least 48 hrs., but can be 12, 24, 36, 48, or even 60 hrs.).

Solvent: Ionic liquids: Scoured and bleached cotton fibers were subjected to mechanical grinding with rotating steel blades using a Wiley mill (Thomas Scientific) or other mechanical means. Fibers were scoured and bleached to remove waxes, pectin and pigments that are present mainly in the primary cell wall.

Cotton fibers were subjected to cryogrinding using a freezer mill (SPEX Sample Prep 6970EFM Freezer/Mill). Fibers were frozen in liquid nitrogen for at least 15 min. Then, they were ground with a pulverizing steel impactor to obtain cotton powder. Example of conditions in the freezer Mill were: 4 min at a rate of 7 cycles/second, followed by 1 min of freezing in liquid nitrogen and another grinding cycle. This cycle was run 6 times for a total of 24 mins. of cryogenic grinding.

Microcrystalline cellulose (MCC) derived from wood. To dissolve FD cotton or FD MCC: (1) the moisture in fibers was removed by drying at temperatures ranging between 100° C. and 120° C. overnight prior to dissolution; (2) the IL and ground FD cotton or FD MCC (concentration varying between 1-15 wt %) were weighed separately; (3) the ground FD cotton or FD MCC were slowly added to IL while stirring; (4) the mixture was heated to 80° to 120° C. with several 3-5 second pulses in a microwave oven; and (5) the mixture was placed in a laboratory oven maintained at temperatures ranging from 50° C. to 90° C. for at least 24 hrs.

A co-solvent can be used to adjust the viscosity of Cellulose-Ionic liquid such as, e.g., Dimethyl sulfoxide (DMSO) or Dimethylformamide (DMF).

Film preparation. The cellulose solution can be cast on glass slide and gently pressed with other glass slide to spread it uniformly to prepare a film. The glass slide with solution spread on it was left on the lab benchtop at ambient temperature for gelation. Once the film was formed on the glass slide, it was immersed in DI water for regeneration. The water exchange was applied to regenerate films in fresh DI water to remove the solvent. Wet films were freeze-dried for further characterization.

An automatic film applicator can be used to form cellulose films with uniform thickness. The process can be optimized and scaled up to produce cellulose films with various dimensions.

Fiber production. The cellulose solution can be placed in a spinneret and wet spinning process can be performed to produce fibers. Various additives can be added to the cellulose solution to produce fibers with the tensile properties required for the spinning process. Regenerated cotton fibers can be functionalized to impart new properties such as antimicrobial, anti UV radiation.

These fibers can then be blended with cotton fibers to produce a blend of cotton-regenerated cotton fibers.

The cellulose solution can be also electrospun to produce fibers and/or mat of fibers (such as non-woven type of materials).

3D printed materials. Cellulose gels with adjusted viscosity can be placed in 3D cartridges and different materials can be printed (scaffolds for example) to serve as cell growth support for example. Other component can be added in the gels to provide specific function such as conductivity (such carbon nano-tubes) or form composite materials.

Porous materials production. The $CO_2$ supercritical drying is used to dehydrate the gels in a supercritical dryer (such as Jumbo Critical Point Dryer SPI Supplies, West Chester, Pa., USA) equipped with a water jacket for cooling and heating (Thermo Scientific NesLab-RTE 10, Newington, N.H., USA). Conditions in the supercritical dryer depend on the manufacturer recommendations. For example: The supercritical drying is first performed at 10° C. under 5 MPa with liquid $CO_2$, and the excess acetone was purged intermittently for 30 sec. at the same pressure and temperature until the gels were filled with liquefied $CO_2$ instead of acetone. Next, the supercritical drying system is pressurized to 8 MPa and the temperature is increased to 35° C. to dehydrate the gels in approximately 3 hrs. When the total amount of the interstitial liquefied $CO_2$ is removed, the system is slowly depressurized and the supercritical dryer is cooled down to collect the porous materials. The shape of the materials prepared will depend on the mold used to form the gel.

Freeze-drying can be also performed to sublimate the water inside the gel. Different shapes of materials can be obtained with varying degrees of porosity.

It will be obvious to those having skill in the art that many changes may be made to the details of the above-described embodiments without departing from the underlying principles of the invention. The scope of the present invention should, therefore, be determined only by the following claims.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), propertie(s), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

1. Han, J. S. Properties of nonwood fibers, TAPPI 1998 North American Noonwood Symposium at Atlanta, Ga., Feb. 17-18, 1998.
2. Fang, L., and J. M. Catchmark. Characterization of cellulose and other exopolysaccharides produced from Gluconacetobacter strains Carbohydrate polymers 115 (2015): 663-669.
3. http://www.ers.usda.gov/topics/crops/cotton-wool.aspx#.UappautAuwY
4. Hegde R. R., A. Dahiya, and M. G. Kamath, 2004, Cotton fibers, http://www.engr.utk.edu/mse/pages/Textiles/Cotton%20fibers.htm
5. Lindman, B., G. Karlström, and L. Stigsson. On the mechanism of dissolution of cellulose. Journal of Molecular Liquids 156 (2010): 76-81.
6. Zhang, L., D. Ruan, and S. Gao. Dissolution and regeneration of cellulose in NaOH/thiourea aqueous solution. Journal of Polymer Science Part B: Polymer Physics 40 (2002): 1521-1529.
7. Duchemin, B. J. C., M. P. Staiger, N. Tucker, and R. H. Newman. Aerocellulose based on all cellulose composites. Journal of Applied Polymer Science 115 (2010), 216-221.
8. Qi, H., C. Chang, and L. Zhang. Effects of temperature and molecular weight on dissolution of cellulose in NaOH/urea aqueous solution. Cellulose 15 (2008): 779-787.
9. Jing, H., Z. Liu, H. Li, G. Wang, and J. Pu. Solubility of wood-cellulose in LiCl/DMAC solvent system. Forestry Studies in China 9 (2007): 217-220.
10. Perepelkin, K. E. Lyocell fibres based on direct dissolution of cellulose in N-methylmorpholine N-oxide: development and prospects. Fibre Chemistry 39 (2007): 163-172.
11. Cai, J., S. Kimura, M. Wada, S. Kuga, and L. Zhang. Cellulose aerogels from aqueous alkali hydroxide-urea solution. ChemSusChem 1 (2008): 149-154.
12. Gavillon, R., and T. Budtova. Aerocellulose: new highly porous cellulose prepared from cellulose-NaOH aqueous solutions. Biomacromolecules 9 (2007): 269-277.
13. Mazza, M., D. A. Catana, C. Vaca-Garcia, and C. Cecutti. Influence of water on the dissolution of cellulose in selected ionic liquids. Cellulose 16 (2009): 207-215.
14. Sescousse, R., R. Gavillon, and T. Budtova. Aerocellulose from cellulose-ionic liquid solutions: preparation, properties and comparison with cellulose-NaOH and cellulose-NMMO routes. Carbohydrate Polymers 83 (2011): 1766-1774.
15. Chen, P., H. S. Kim, S. M. Kwon, Y. S. Yun, and H. J. Jin. Regenerated bacterial cellulose/multi-walled carbon nanotubes composite fibers prepared by wet-spinning. Current Applied Physics 9 (2009): e96-e99.
16. Wu, X. L., and P. Liu. Facile preparation and characterization of graphene nanosheets/polystyrene composites. Macromolecular Research 18 (2010):1008-1012.
17. Yan, Z. Y., S. Y. Chen, H. P. Wang, B. Wang, C. S. Wang, and J. M. Jiang. Cellulose synthesized by *Acetobacter xylinum* in the presence of multi-walled carbon nanotubes. Carbohydrate Research 343 (2008): 73-80.
18. Feng, Y., X. Zhang, Y. Shen, K. Yoshinoc, and W, Feng. A mechanically strong, flexible and conductive film based on bacterial cellulose/graphene nanocomposite. Carbohydrate Polymers 87 (2012): 644-649.
19. Zhang, X., X. Liu, W. Zheng, and J. Zhu. Regenerated cellulose/grapheme nanocomposite films prepared in DMAC/LiCl solution. Carbohydrate Polymers 88 (2012): 26
20. Kim, C. J., W. Khan, D. H. Kim, K. S. Cho, and S. Y. Park. Graphene oxide/cellulose composite using NMMO monohydrate. Carbohydrate Polymers 89 (2011): 903-909.
21. Ladd, C., J. H. So, J. Muth, and M. D. Dickey. 3D printing of Free Standing Liquid metal microstructures. Advanced Materials 25 (2013): 5081-5085.
22. Markstedt, K., J. Sundberg, and P. Gatenholm. 3D bioprinting of cellulose structures from an ionic liquid. 3D Printing and Additive Manufacturing 1 (2014): 115-121.
23. Wang, S., Y. Zhang, N. Abidi, and L. Cabrales. Wettability and surface free energy of graphene films. Langmuir 25 (2009): 11078-11081.

24. Becerril, H. A., J. Mao, Z. Liu, R. M. Stoltenberg, Z. Bao, and Y. Chen. Evaluation of solution-processed reduced graphene oxide films as transparent conductors. ACS nano 2 (2008): 463-470.

What is claimed is:

1. A method for making a 3D printing cotton cellulose-based conductive composite, comprising:
    obtaining a core matrix comprising cotton cellulose fibers or cotton microcrystalline cellulose, wherein the cotton cellulose fibers comprise 1-20% of bleached cotton cellulose fiber with a Degree of Polymerization (DP) over 5,000, or the microcrystalline cellulose comprises 5-50% microcrystalline cellulose with a DP of 200-250;
    dissolving the cotton cellulose fibers or cotton microcrystalline cellulose in a solvent;
    adding a 3D printing process enhancer to stabilize the cotton cellulose fibers or cotton microcrystalline cellulose disrupted during a printing process;
    printing, layering or depositing the dissolved cotton cellulose fibers or cotton microcrystalline cellulose and a conductive material; and
    stabilizing the printed cotton cellulose fibers or cotton microcrystalline cellulose to form the 3D printing cotton cellulose-based conductive composite.

2. The method of claim 1, wherein the cotton cellulose fiber or cotton microcrystalline cellulose is freeze-dried before use, or the cotton cellulose fiber or cotton microcrystalline cellulose is freeze-dried prior to dissolving in the solvent to enhance the solubility of cellulose in the solvent.

3. The method of claim 1, wherein the conductive material is selected from at least one of a carbon nanotube or graphene oxide.

4. The method of claim 1, further comprising the step of adjusting the amount and viscosity of the dissolved cellulose prior to 3D printing.

5. The method of claim 1, wherein the solvent is a LiCl/DMAc solvent system in which the cotton cellulose fibers or cotton microcrystalline cellulose is first mixed with DMAc at 80-90° C. for 20 mins., LiCl is added at a temperature of 80-90° C. for 2-4 hrs., cooling down to room temperature and then reheating to 80-90° C. until the cellulose mixture is clear.

6. The method of claim 1, wherein a carbon nanotube (CNT) solution is separately placed in different ink boxes from the cellulose dissolved in a solvent that is a LiCl/DMAc solvent system, and the CNT and dissolved cellulose are mixed into a cellulose/CNT conductive composite that is printed layer-by-layer with a two-channel 3D printer.

7. The method of claim 1, wherein a graphene oxide (GO) solution is mixed with an alginate to enhance the viscosity of GO solution, and the GO solution is transferred in different ink boxes with the cellulose dissolved in the solvent that comprises a LiCl/DMAc solvent system, or the composite comprises a centered GO surrounded by cellulose that is printed by a two-channel 3D printer, wherein the composite comprises 1-10% GO mixed with cellulose dissolved in NaOH/urea solvent system and the mixture is stirred for at least 12 hrs. until it appears homogenous, or the composite comprises 1-10% GO mixed with cellulose dissolved in NaOH/urea solvent system and the mixture is mounted in an ink box and printed by the 3D printer to form a membrane-like scaffold.

8. The method of claim 1, wherein the solvent is a 4-8% NaOH/4-12% urea solvent system that used to dissolve the cellulose prior to printing.

9. The method of claim 1, wherein the composite is formed into at least one of a photovoltaic cell, a solar cell, a conductive material for biological signal delivery, electrical paper, conductive fabric, one or more wires, transistors, resistors, capacitors, diodes, vias, Thin-Film Transistors (TFT), Random Access Memory (RAM), Static Random Access Memory (SRAM), FRAMs ferroelectric RAM (FRAM), pixels, Liquid Crystal Displays (LCD), Organic LED (OLED), a gate array or programmable read-only memory (PROM), N-type or P-type metal-oxide-semiconductor logic field effect transistors (MOSFETs), n-channel metal oxide semiconductors (NMOS), p-channel metal oxide semiconductors (PMOS), organic thin film transistors (OTFTs), batteries, energy storage, antennas, sensors, or plates.

10. The method of claim 1, wherein the 3D printing process enhancer is selected from at least one of alginate, gelatin, polyvinyl alcohol, or polylactide.

11. The method of claim 1, further comprising the step of adding a biopolymer or chitin, or a gel to the dissolved cellulose to form a cellulose-biopolymer, a cellulose-chitin composite, or a cellulose-gel composite.

* * * * *